United States Patent
Katsuki et al.

(10) Patent No.: US 7,164,341 B2
(45) Date of Patent: Jan. 16, 2007

(54) SURFACE-MOUNTABLE PTC THERMISTOR AND MOUNTING METHOD THEREOF

(75) Inventors: Takayo Katsuki, Omihachiman (JP); Takeo Haga, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/965,538

(22) Filed: Sep. 27, 2001

(65) Prior Publication Data

US 2002/0057186 A1    May 16, 2002

(30) Foreign Application Priority Data

Oct. 24, 2000   (JP)   ............... 2000-323573

(51) Int. Cl.
*H01C 1/14*    (2006.01)
*H01C 7/10*    (2006.01)

(52) U.S. Cl. .................... 338/22 R; 338/322

(58) Field of Classification Search .......... 338/22 R, 338/22 SD, 232–236, 322–325, 321, 315–318; 361/811, 782, 690, 704, 714; 219/505, 541, 219/545
See application file for complete search history.

(56) References Cited

U.S. PATENT DOCUMENTS

| | | | | |
|---|---|---|---|---|
| 2,418,461 | A | * | 4/1947 | Becker et al. ............... 29/621 |
| 3,214,719 | A | * | 10/1965 | Turner ..................... 338/22 R |
| 3,793,604 | A | * | 2/1974 | Duggan et al. ............ 338/22 R |
| 4,099,154 | A | * | 7/1978 | Bar .............................. 338/220 |
| 4,635,026 | A | | 1/1987 | Takeuchi |
| 4,912,450 | A | * | 3/1990 | Yoneda et al. ............ 338/22 R |
| 5,117,089 | A | * | 5/1992 | Honkomp et al. ........... 219/201 |
| 5,168,257 | A | * | 12/1992 | Frielinghaus ............... 338/322 |
| 5,420,745 | A | * | 5/1995 | Hidaka et al. ............. 361/306.1 |
| 5,557,251 | A | * | 9/1996 | Takaoka .................... 338/22 R |
| 5,726,623 | A | | 3/1998 | Camp |
| 5,856,773 | A | | 1/1999 | Chandler et al. |
| 5,929,743 | A | * | 7/1999 | Miyazaki et al. ......... 338/22 R |
| 5,939,972 | A | * | 8/1999 | Nagao et al. ............. 338/22 R |
| 5,977,861 | A | * | 11/1999 | Duggal et al. ............ 338/22 R |

(Continued)

FOREIGN PATENT DOCUMENTS

CN    1235357 A    11/1999

(Continued)

OTHER PUBLICATIONS

Official Communication issued in the German Patent Application No. 10152537.0-34, mailed on Aug. 1, 2006.

*Primary Examiner*—Tu Hoang
(74) *Attorney, Agent, or Firm*—Keating & Bennett, LLP

(57) ABSTRACT

A surface-mountable PTC thermistor element includes electrodes disposed on a top surface and a bottom surface of a thermistor element body, in which each of the electrodes is connected with a terminal respectively and each of the terminals is extended downward. An upper terminal is protected from being detached by a reaction force acting against pressing at the time of press-mounting the PTC thermistor element onto a surface of a substrate. A vertical-leg portion of the lower terminal is placed inside the thermistor element body in the radial direction from the outer edge of the thermistor element body. Preferably, the vertical-leg portion of the lower terminal is placed in the vicinity of the center of the thermistor element body.

16 Claims, 7 Drawing Sheets

U.S. PATENT DOCUMENTS 5,990,779 A * 11/1999 Katsuki et al. ............ 338/22 R
6,147,330 A * 11/2000 Ikeda et al. ................ 338/22 R
6,232,868 B1 * 5/2001 Rehnelt ..................... 338/22 R

FOREIGN PATENT DOCUMENTS

| | | | |
|---|---|---|---|
| DE | 197 41 143 C1 | 6/1999 | |
| JP | 61-22307 U | 2/1986 | |
| JP | 63-46802 | 3/1988 | |
| JP | 5-299205 * | 5/1993 | ............ 338/22 R |
| JP | 5-299206 * | 5/1993 | ............ 338/22 R |
| JP | 8-31605 | 2/1996 | |
| JP | 09-129404 | 5/1997 | |
| JP | 09-246013 | 9/1997 | |
| JP | 10-214704 | 8/1998 | |
| WO | 98/20567 A1 | 5/1998 | |
| WO | 99/01875 A1 | 1/1999 | |
| WO | WO 00/04560 | 1/2000 | |

* cited by examiner

FIG.15(a) PRIOR ART
FIG.15(b) PRIOR ART
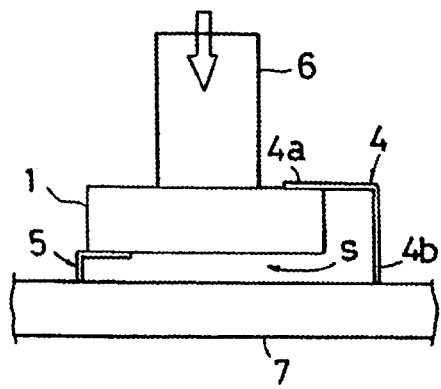
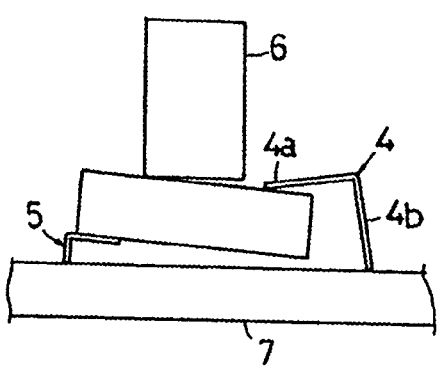

SURFACE-MOUNTABLE PTC THERMISTOR AND MOUNTING METHOD THEREOF

BACKGROUND OF THE INVENTION

1. Field of the Invention

The present invention relates to a surface-mountable PTC (positive temperature coefficient) thermistor, and a method of surface-mounting such a PTC element onto a mounting target such as a substrate.

2. Description of the Related Art

In FIGS. 13 and 14, a perspective view and a front view of a conventional surface-mounting PTC thermistor are illustrated, respectively. The surface-mountable PTC thermistor includes top and bottom surfaces of an element body 1 that have a round button shape, electrodes 2 and 3 and terminals 4 and 5, which are connected to each of the electrodes 2 and 3 respectively, and are bent extending downward in a hooked configuration. The PTC elements are shipped and sold in a package consisting of an embossed tape or other similar packaging. As shown in FIG. 15(a), the PTC elements are picked one by one by a sucking nozzle 6, which defines an element holder that is part of a mounting apparatus, and the PTC elements are mounted on a mounting target so as to be subsequently fixed by soldering. The PTC element is mounted such that a space s is formed between the element body 1 and the substrate 7 in order to prevent heat transfer from the element body 1 to the substrate 7.

In the above-mentioned conventional structure, when mounting a PTC element onto a predetermined position of a substrate, the PTC element is pressed onto the surface of the substrate 7 by an appropriate force together with the sucking nozzle 6 itself so that each of the terminals 4 and 5 is firmly contacted with the solder (not shown in the figure) disposed at the mound of the circuit pattern.

In this case, each of the terminals 4 and 5 is connected near the outer edge of the upper and lower electrodes 2 and 3 of the element body 1, and the vertical leg portions 4b and 5b of each of the terminals 4 and 5, respectively, is placed outside the element body 1. This results in concentration of stress acting in the direction of detachment on the junction portion 4a of the upper terminal 4 with the electrode 2 caused by the reaction force acting against the pressing load on the substrate. Thus, the junction of the upper terminal 4 might be broken as shown in FIG. 15(b). Therefore, the pressing is to be adjusted to the junction strength of the electrode 2 and the junction portion 4a, thereby making it difficult for adjustment, because even elements having the same specifications have a different junction strength.

SUMMARY OF THE INVENTION

In order to overcome the problems described above, preferred embodiments of the present invention provide a surface-mountable PTC thermistor and a mounting method thereof that prevents the above-described problems from occurring at the time of mounting.

According to a first preferred embodiment of the present invention, a surface-mountable PTC thermistor element includes a thermistor element body and electrodes provided on a top surface and a bottom surface of the thermistor element body, and upper and lower terminals arranged such that each of the electrodes is connected with a respective one of the terminals, and each of the terminals is extended downward, wherein a vertical-leg portion of the lower terminal is placed inside of the thermistor element body in a radial direction from an outer edge of the thermistor element body.

Also, in the surface-mountable PTC thermistor element, the vertical-leg portion of the lower terminal may be placed in the vicinity of the center of the thermistor element body.

Furthermore, in the surface-mountable PTC thermistor element, a junction portion of an upper terminal and an upper electrode may be arranged to overlap each other at the approximate central portion of the element body.

With these unique arrangements, the distance becomes small from the vertical-leg portion of the lower terminal to the center of the force pressing the element onto the surface of a substrate, thereby minimizing the upward force acting on the vertical-leg portion of the upper terminal. In summary, a reaction force acting on both of the vertical-leg portions is directly proportional to the distance from the center of the pressing force to each of the vertical-leg portions so that the smaller the distance is between the vertical-leg portion of the lower terminal and the center of the pressing force, the smaller the upward force becomes acting on the vertical-leg portion of the upper terminal.

Thus, it is possible to minimize the upward force acting on the vertical-leg portion of the upper terminal, thereby making it possible to prevent detachment of the junction of the upper electrode from the upper terminal. Therefore, even if an irregularity exists in the junction strength at the junction portion of the upper electrode with the upper terminal, it is very easy to adjust the pressing force.

Also, if the vertical-leg portion of the lower terminal is placed in the vicinity of the center of the element body, when the pressing force is applied in the vicinity of the center of the element, the leg portion of the lower terminal supports most of the pressing force. Thus, it is possible to minimize the upward force acting on the vertical-leg portion of the upper terminal, thereby making it possible to prevent detachment of the upper electrode more securely.

Furthermore, if the junction portion of an upper terminal and an upper electrode are arranged to overlap each other at the approximate central portion of the element body, when the vicinity of the center of the element is pressed by an element holder, a part of the junction portion of the upper terminal with the upper electrode is sandwiched between a holding part and a top surface of the element body, thereby making it difficult for the upper terminal to be detached from the upper electrode.

Thus, the strength of resistance against detachment of the upper terminal is reinforced and greatly increased by sandwiching the upper terminal between an element holder of a mounting apparatus and the element body, thereby promoting the advantageous effects that are described above.

According to another preferred embodiment of the present invention, a method of mounting a surface-mountable PTC thermistor includes the steps of holding the thermistor element via an element holder and surface-mounting the thermistor element onto a mounting target, the thermistor element being a surface-mountable PTC thermistor element having electrodes formed on a top surface and a bottom surface of the thermistor element body, in which each of the electrodes is connected with a terminal respectively, and each of the terminals is extended downward, wherein a vertical-leg portion of a lower terminal is placed inside the thermistor element body in a radial direction from an outer edge of the thermistor element body, and the holding area of the thermistor element body held by the element holder and at least a part of the vertical-leg portion being overlapped in the vertical direction, and the element body is held by the element holder to be surface-mounted onto a mounting target.

With this unique arrangement, the entire area of the thermistor element body that is held by the element holder works as a pressing action area, so that the vertical-leg portion of the lower terminal in this area supports all of the pressing force.

Thus, it is possible to press-mount an element onto the surface of the mounting target while reliably preventing any detachment of the upper terminal, thereby making it effective to carry out surface-mounting securely.

Other features, elements, steps, characteristics and advantages of the present invention will become apparent from the following detailed description of preferred embodiments with reference to the attached drawings.

BRIEF DESCRIPTION OF THE DRAWINGS

FIG. 15 is a front view illustrating a mounting process of a conventional surface-mountable PTC thermistor.

DETAILED DESCRIPTION OF PREFERRED EMBODIMENTS

Preferred embodiments of the present invention will now be described below with reference to the accompanying drawings.

Figure 1:
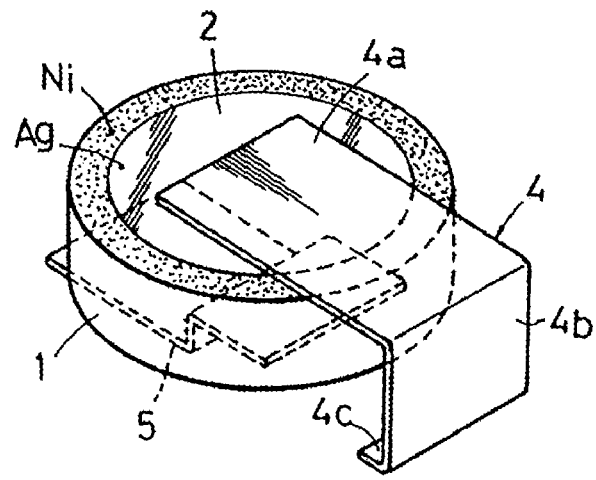
FIG. 1 is a perspective view of a surface-mountable PTC thermistor according to a first preferred embodiment of the present invention as viewed from a top surface thereof.
Figure 2:
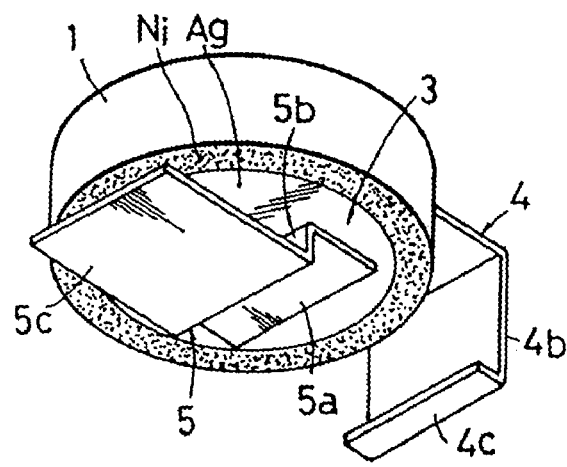
FIG. 2 is a perspective view of a surface-mountable PTC thermistor according to the first preferred embodiment as viewed from a bottom surface thereof.
Figure 3:
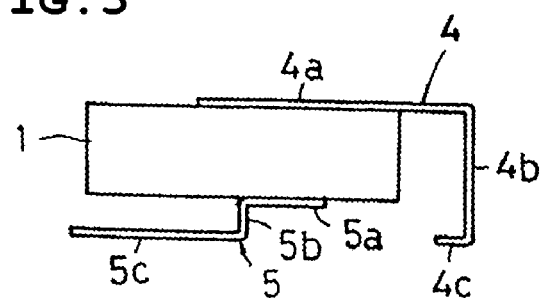
FIG. 3 is a front view of a surface-mountable PTC thermistor according to the first preferred embodiment of the present invention.

FIGS. 1 to 3 illustrate a surface-mountable PTC thermistor element according to a first preferred embodiment of the present invention. The surface-mountable PTC thermistor element includes an element body 1 having a substantially round button shape and gap-type electrodes 2 and 3, each having a nickel layer Ni and a silver layer Ag, provided on a top surface and a bottom surface of the element body 1. Each of the electrodes 2 and 3 is connected at a junction with a respective one of two terminals 4 and 5, respectively, which terminals 4, 5 have a flat-plate shape and are preferably made of stainless steel defining a base material.

The upper terminal 4 is arranged to extend lengthwise in the radial direction of the element body 1 such that a junction portion 4a of the upper terminal 4 with the electrode 2 is overlapped sufficiently with the electrode 2 in a range from a central part of the element body 1 to the outer edge thereof. Also, an outside-extension portion of the terminal 4 is bent vertically downward at the outside of the element body 1 to define a vertical-leg portion 4b. Also, the vertical-leg portion 4b extends downward a little longer than the bottom surface of the element body 1, and the lower end of the vertical-leg portion 4b is bent to define the horizontal connection portion 4c.

Furthermore, the lower terminal 5 has a junction portion 5a connected with the electrode 3 only near the central portion of the element body 1, and from an end of the junction portion 5a, the short vertical-leg portion 5b is formed by bending vertically in the downward direction. In addition, a lower-end part of the vertical-leg portion 5b is bent and extended as far as a position close to the outer edge of the element body 1 to define the horizontal connecting portion 5c which extends lengthwise in the radial direction and has substantially the same height as the connecting portion 4c of the upper terminal 4.

In an example of this preferred embodiment of the present invention, the element body 1 preferably has a diameter of about 8.0 mm, a thickness of about 2.0 mm, a CP of about 100° C., and a resistance value R25 of about 10Ω, and the electrodes 2 and 3 preferably include a silver layer with a diameter of about 6.0 mm, and each of the terminals 4 and 5 preferably includes a stainless steel plate having a width of about 4.0 mm, a thickness of about 0.15 mm to about 0.20 mm, Ni undercoated and Sn surface-plated, and the vertical-leg portion 4b is about 3.5 cm in height, and the connecting portions 4C and 5C are about 1.0 mm and about 4.0 mm in length, respectively.

Figure 4:
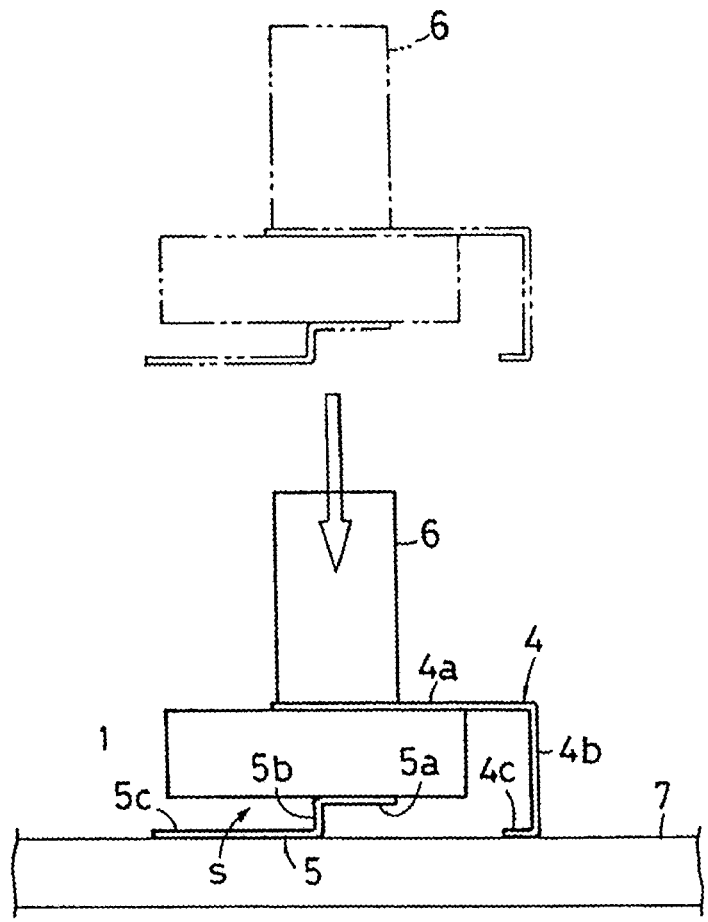
FIG. 4 is a front view of a mounting process for mounting a PTC thermistor according to a preferred embodiment of the present invention.

The elements having the above-mentioned structure are supplied and shipped in a package including an embossed tape or other similar packaging, and as shown in FIG. 4, the elements are picked one by one by the sucking nozzle 6 that defines an element holder of a mounting apparatus, and mounted to be fixed by soldering onto a predetermined position of the substrate 7. The element is mounted such that the space s is formed for heat insulation between the element body 1 and the substrate 7 in order to prevent heat transfer from the element body 1 to the substrate 7.

When mounting the element onto the surface of the substrate 7, the sucking nozzle 6 holding a surface-mountable PTC thermistor element is moved near to the surface of the substrate 7, and then from a certain height, the surface-mountable PTC thermistor element is pressed onto the surface of the substrate 7 with an appropriate force using the weight of the element, a spring force, and other forces. At this time, if the sucking nozzle 6 is placed in the vicinity of the center of the element body 1, the vertical-leg portion 5b of the lower terminal 5, which is within the area of the element that is held by the sucking nozzle 6, supports most of the pressing force applied by the sucking nozzle 6, thereby minimizing the reaction force acting on the vertical-leg portion 4b of the upper terminal 4.

Figure 5:
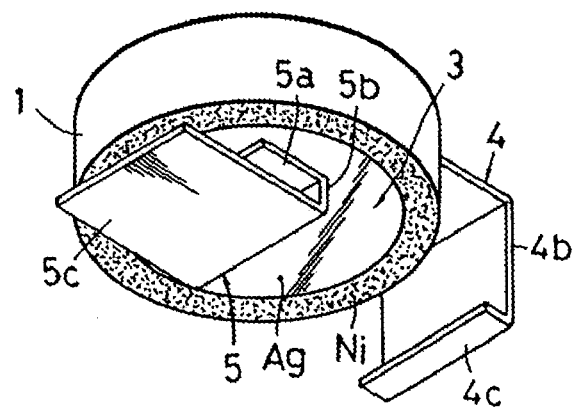
FIG. 5 is a perspective view of a surface-mountable PTC thermistor according to a second preferred embodiment as viewed from a bottom surface thereof.
Figure 6:
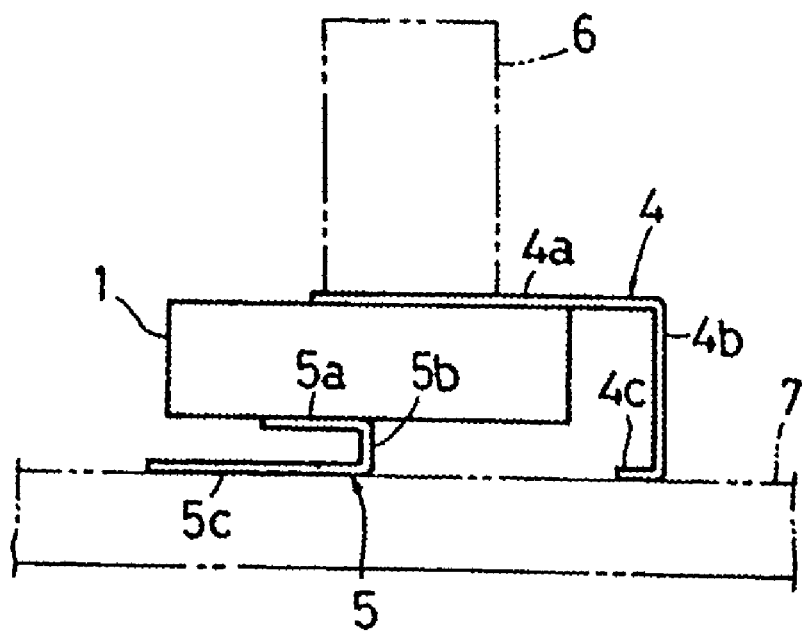
FIG. 6 is a front view of a surface-mountable PTC thermistor according to the second preferred embodiment of the present invention.

FIGS. 5 and 6 illustrate a surface-mountable PTC thermistor according to a second preferred embodiment of the present invention. In this surface-mountable PTC thermistor, the junction portion 5a of the lower terminal 5 with the electrode 3 is bent in the reverse direction in the structure of the first preferred embodiment described above, but has the same functionality as that of the first preferred embodiment.

Figure 7:
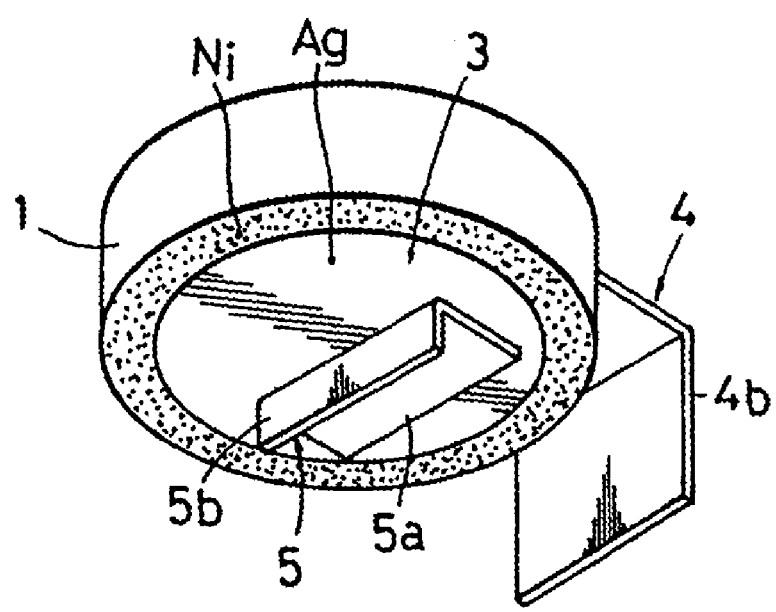
FIG. 7 is a perspective view of a surface-mountable PTC thermistor according to a third preferred embodiment as viewed from the bottom surface thereof.
Figure 8:
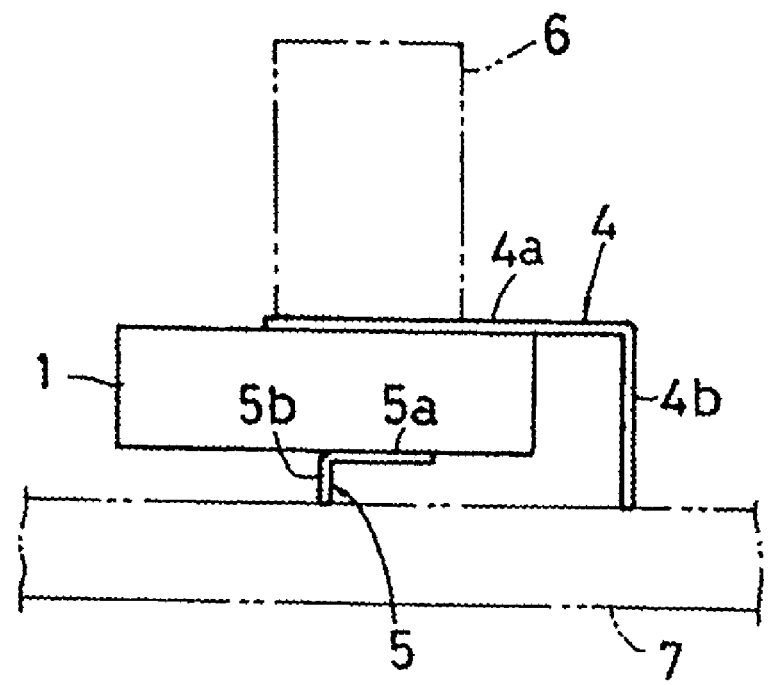
FIG. 8 is a front view of a surface-mountable PTC thermistor according to the third preferred embodiment of the present invention.

FIGS. 7 and 8 illustrate a surface-mountable PTC thermistor according to a third preferred embodiment of the present invention. The surface-mountable PTC thermistor has both of the terminals 4 and 5, of which connecting portions 4c and 5c which were included in the structure of the first preferred embodiment have been deleted, thereby resulting in high pressing stress on the surface of a substrate.

Figure 9:
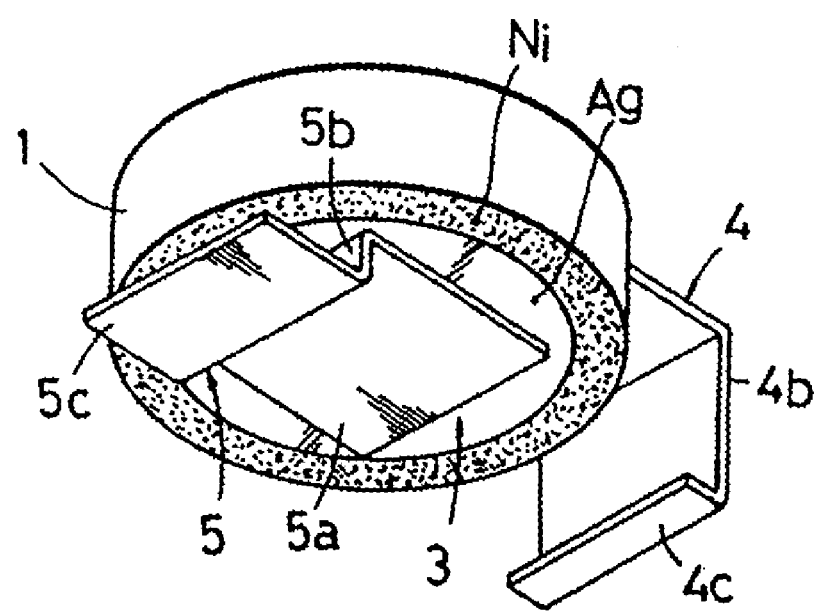
FIG. 9 is a perspective view of a surface-mountable PTC thermistor according to a fourth preferred embodiment as viewed from the bottom surface thereof.
Figure 10:
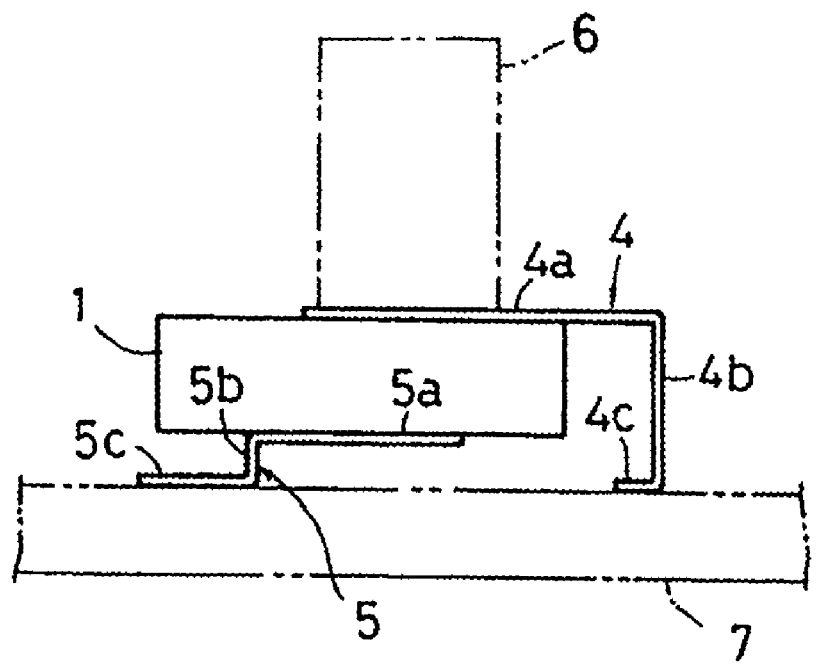
FIG. 10 is a front view of a surface-mountable PTC thermistor according to the fourth preferred embodiment of the present invention.

FIGS. 9 and 10 illustrate a surface-mountable PTC thermistor according to a fourth preferred embodiment of the present invention. The surface-mountable PTC thermistor has the lower terminals 5 with an altered shape as compared to the structure of the first preferred embodiment. In this case, the vertical-leg portion 5b of the lower terminal 5 is placed outside the center of the element body 1 in the radial direction, and inside the outer edge of the element body 1 in the radial direction.

Figure 11:
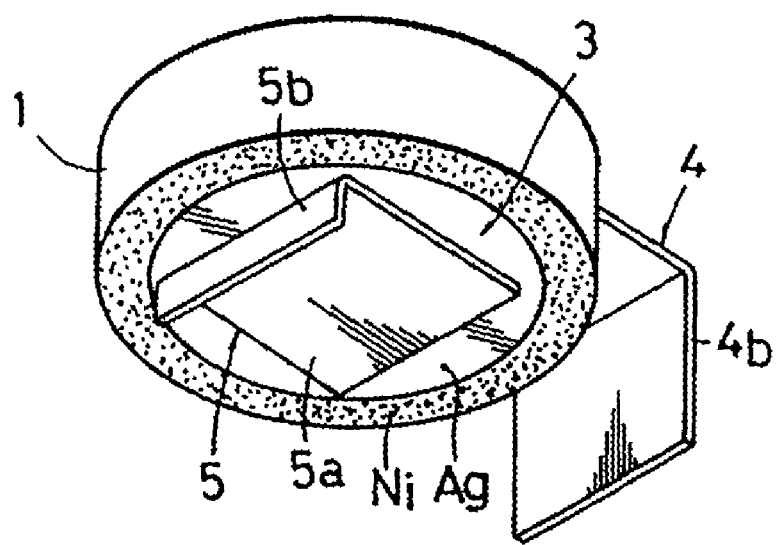
FIG. 11 is a perspective view of a surface-mountable PTC thermistor according to a fifth preferred embodiment as viewed from the bottom surface thereof.
Figure 12:
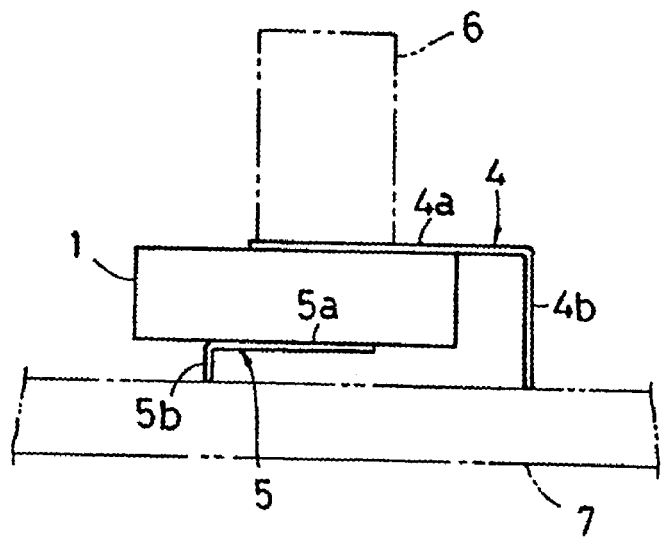
FIG. 12 is a front view of a surface-mountable PTC thermistor according to the fifth preferred embodiment of the present invention.
Figure 13:
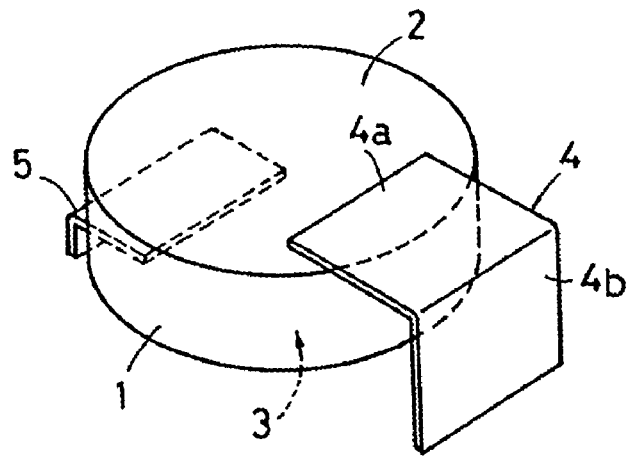
FIG. 13 is a perspective view of a conventional surface-mountable PTC thermistor as viewed from a top surface thereof.
Figure 14:
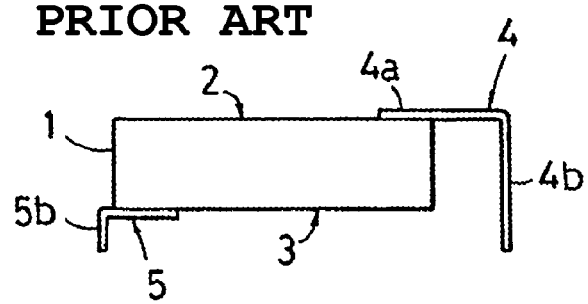
FIG. 14 is a front view of a conventional surface-mountable PTC thermistor.

FIGS. 11 and 12 illustrate a surface-mountable PTC thermistor according a fifth preferred embodiment of the present invention. The surface-mountable PTC thermistor includes the terminals 4 and 5, of which connecting portions 4c and 5c, respectively, which were included in the structure of the fourth preferred embodiment have been deleted, thereby resulting in high pressing stress on the surface of a substrate.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface-mountable PTC thermistor element comprising:
    a thermistor element body including a top surface and a bottom surface;
    electrodes disposed on the top surface and the bottom surface of the thermistor element body;
    lower and upper terminals arranged such that each of the electrodes is connected with a respective one of the lower and upper terminals, and each of the lower and upper terminals is extended downward; wherein
    said lower terminal includes a junction portion, a short vertical-leg portion connected to and bent vertically in a downward direction from the junction portion such that the short vertical-leg portion extends perpendicular to the surface of the thermistor element body and to the junction portion, and a lower-end portion which extends entirely in a plane substantially parallel to the junction portion and substantially perpendicular to the short vertical-leg portion;
    said short vertical-leg portion is directly connected and extends directly between the junction portion and the lower-end portion;
    the junction portion of the lower terminal is mechanically attached to one of the electrodes;
    the upper and lower terminals contact only the electrodes on the top and bottom surfaces of the thermistor element body and a mounting surface when the surface-mountable PTC thermistor element is mounted on the mounting surface;
    the lower-end portion of the lower terminal is disposed in contact with the mounting surface when the surface-mountable PTC thermistor element is mounted on the mounting surface; and
    said vertical-leg portion of the lower terminal is located closer to the center of the thermistor element body than to a periphery of the thermistor element body so as to be spaced inwardly from the periphery of the thermistor element body.

2. A surface-mountable PTC thermistor according to claim 1, wherein the junction portion of the lower terminal is connected with one of the electrodes at a location only near the central portion of the thermistor element body.

3. A surface-mountable PTC thermistor element according to claim 1, wherein a junction portion of the upper terminal and one of the electrodes are arranged to overlap each other at a central portion of the thermistor element body.

4. A surface-mountable PTC thermistor element according to claim 1, wherein the thermistor element body has a substantially round button shape.

5. A surface-mountable PTC thermistor element according to claim 1, wherein each of the electrodes includes a nickel layer and a silver layer.

6. A surface-mountable PTC thermistor according to claim 1, wherein each of the terminals has a flat-plate shaped configuration and is made of stainless steel.

7. A surface-mountable PTC thermistor according to claim 1, wherein a lower-end portion of the lower terminal defines a horizontal connection portion arranged to be connected to the mounting surface.

8. A surface-mountable PTC thermistor according to claim 1, wherein the upper terminal includes a vertical-leg portion that is longer than the vertical-leg portion of the lower terminal.

9. A surface-mountable PTC thermistor according to claim 8, wherein a lower end of the vertical-leg portion of the upper terminal is bent to define a horizontal connection portion.

10. A surface-mountable PTC thermistor element comprising:
    a thermistor element body including a top surface and a bottom surface;
    electrodes disposed on the top surface and the bottom surface of the thermistor element body;
    lower and upper terminals arranged such that each of the electrodes is connected with a respective one of the lower and upper terminals, and each of the lower and upper terminals is extended downward; wherein
    said upper terminal includes a junction portion contacting the electrode located on the top surface of the thermistor element body, and a vertical-leg portion extending perpendicularly from an end of the junction portion;
    said lower terminal includes a junction portion contacting the electrode located on the bottom surface of the thermistor element body, and a vertical-leg portion connected to and bent perpendicularly from an end of the junction portion of said lower terminal;

said vertical-leg portion of said upper terminal is longer than said vertical-leg portion of said lower terminal;

said vertical-leg portion of the lower terminal is located closer to the center of the thermistor element body than to a periphery of the thermistor element body so as to be spaced inwardly from the periphery of the thermistor element body;

a lower end of said vertical-leg portion of said upper terminal is located in a common plane with a lower end of said vertical-leg portion of said lower terminal, the common plane being parallel to said top and bottom surfaces of the thermistor element body and located at a mounting surface of a substrate upon which the surface-mountable PTC thermistor element is mounted;

said junction portion of said upper terminal and said junction portion of said lower terminal overlap with each other at a central portion of said thermistor element body with the thermistor element body disposed therebetween; and the upper and lower terminals contact only the electrodes on the upper and lower surfaces of the thermistor element body and the mounting surface when the surface mountable PTC thermistor element is mounted on the mounting surface.

11. A surface-mountable PTC thermistor according to claim 10, wherein said vertical-leg portions of said upper and lower terminals are arranged to be directly mounted to the mounting surface of the substrate.

12. A surface-mountable PTC thermistor according to claim 10, wherein said upper terminal includes a horizontal connection portion extending perpendicularly from an end of said vertical-leg portion of said upper terminal and parallel to said junction portion of said upper terminal, the horizontal connection portion being arranged to be mounted on the mounting surface of the substrate.

13. A surface-mountable PTC thermistor according to claim 10, wherein said lower terminal includes a horizontal connection portion extending perpendicularly from an end of said vertical-leg portion of said lower terminal and parallel to said junction portion of said lower terminal, the horizontal connection portion being arranged to be mounted on the mounting surface of the substrate.

14. A surface-mountable PTC thermistor element according to claim 10, wherein the thermistor element body has a substantially round button shape.

15. A surface-mountable PTC thermistor element according to claim 10, wherein each of the electrodes includes a nickel layer and a silver layer.

16. A surface-mountable PTC thermistor according to claim 10, wherein each of the terminals has a flat-plate shaped configuration and is made of stainless steel.

* * * * *